(12) United States Patent
Kawakami et al.

(10) Patent No.: US 7,196,321 B2
(45) Date of Patent: Mar. 27, 2007

(54) FINE PATTERN FORMING APPARATUS AND FINE PATTERN INSPECTING APPARATUS

(75) Inventors: Eigo Kawakami, Utsunomiya (JP); Hirohisa Ota, Kawagoe (JP); Takashi Nakamura, Tokyo (JP); Kazuyuki Kasumi, Utsunomiya (JP); Toshinobu Tokita, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 156 days.

(21) Appl. No.: 11/147,562

(22) Filed: Jun. 7, 2005

(65) Prior Publication Data

US 2005/0269035 A1 Dec. 8, 2005

(30) Foreign Application Priority Data

Jun. 7, 2004 (JP) ............... 2004-167920

(51) Int. Cl.
*G01N 21/17* (2006.01)
*G11B 9/00* (2006.01)

(52) U.S. Cl. ............... 250/234; 250/306; 250/227.11; 257/256

(58) Field of Classification Search ............ 250/492.2, 250/306, 234, 227.11; 257/256
See application file for complete search history.

(56) References Cited

U.S. PATENT DOCUMENTS

| | | | | |
|---|---|---|---|---|
| 5,294,465 A | * | 3/1994 | Gallagher | ............... 427/523 |
| 5,449,901 A | * | 9/1995 | Fujihira et al. | ............... 250/234 |
| 5,666,190 A | | 9/1997 | Quate et al. | |
| 6,181,097 B1 | * | 1/2001 | Li et al. | ............... 318/592 |
| 6,635,311 B1 | * | 10/2003 | Mirkin et al. | ............... 427/256 |
| 6,867,443 B2 | * | 3/2005 | Liu et al. | ............... 257/226 |
| 6,884,999 B1 | * | 4/2005 | Yedur et al. | ............... 250/306 |
| 7,106,684 B2 | * | 9/2006 | Nam | ............... 369/126 |
| 2002/0101573 A1 | * | 8/2002 | Ishibashi et al. | ............... 355/69 |
| 2004/0026007 A1 | * | 2/2004 | Hubert et al. | ............... 156/64 |
| 2005/0048651 A1 | * | 3/2005 | Ryttsen et al. | ............... 435/459 |
| 2005/0181132 A1 | * | 8/2005 | Mirkin et al. | ............... 427/256 |
| 2005/0205776 A1 | * | 9/2005 | Dana et al. | ............... 250/306 |

* cited by examiner

*Primary Examiner*—Nikita Wells
*Assistant Examiner*—Johnnie L Smith, II
(74) *Attorney, Agent, or Firm*—Morgan & Finnegan LLP

(57) ABSTRACT

Disclosed is a fine pattern forming apparatus and a fine pattern inspecting apparatus. In one preferred form, the fine pattern forming apparatus includes a surface irregularity information reading device for detecting a shape signal corresponding to a surface irregularity of a surface of an original, while scanning the surface by use of a first probe, and a surface irregularity information writing device for processing a substrate to be processed, while scanning a surface of the substrate by use of a second probe, wherein an applied electric voltage to the second probe is changed in accordance with the shape signal while a distance between the second probe and the substrate is kept substantially constant, or the distance between the second probe and the substrate is changed in accordance with the shape signal while the applied electric voltage to the second probe is kept substantially constant, such that the substrate is processed in accordance with the surface irregularity of the original.

17 Claims, 9 Drawing Sheets

FINE PATTERN FORMING APPARATUS AND FINE PATTERN INSPECTING APPARATUS

FIELD OF THE INVENTION AND RELATED ART

This invention relates to a fine pattern forming apparatus for forming a very fine pattern on a substrate by use of a scanning probe microscope. In another aspect, the invention concerns a fine pattern inspecting apparatus for performing inspection of a very fine pattern on the basis of measurement of a shape of the pattern.

Extremely fine microprocessing technology has been required in these years so as to meet further miniaturization of a circuit pattern for semiconductor devices. As a replacement for optical lithography having limitations in regard to the wavelength, microprocessing technology using a scanning probe microscope has been proposed. When a scanning probe microscope is used to draw a circuit pattern for semiconductor devices, the scan speed thereof is a matter and, to solve this, as disclosed in U.S. Pat. No. 5,666,190, a method wherein a plurality of probes are scanned simultaneously to improve the pattern drawing throughput has been proposed.

Where such a scanning probe microscope is used to draw a circuit pattern of semiconductor devices, in addition to the scan speed, there is a problem in relation to conversion of circuit pattern data into data for the probe position inside a transfer region and the applied electric voltage at the corresponding moment. While minuteness is enabled, the amount of data corresponding to one transfer region becomes really huge. Thus, a data conversion processing unit as well as a data accumulating unit for storing data before the conversion and data after the conversion are required. Furthermore, the time required for the data conversion processing may affect the pattern drawing throughput. If plural probes are scanned simultaneously as proposed in the aforementioned U.S. patent, the amount of data to be processed at the same time increases in proportion to the number of probes. It disadvantageously takes much time to carry out the data conversion processing. A further problem is that it takes long time to perform inspection of an extraordinarily fine pattern after it is drawn.

SUMMARY OF THE INVENTION

It is accordingly an object of the present invention to provide a unique and improved fine pattern forming apparatus by which at least one of the inconveniences described above can be solved or reduced.

It is another object of the present invention to provide a fine pattern inspecting apparatus by which at least one of the inconveniences described above can be solved or reduced.

In accordance with an aspect of the present invention, there is provided a fine pattern forming apparatus, comprising: surface irregularity information reading means having a first probe being relatively movable along a surface of a planar plate having a pattern defined by a surface irregularity, said surface irregularity information reading means being adapted to detect surface irregularity information of the surface of the planar plate on the basis of displacement of the first probe as the same is relatively moved relative to the planar plate; and surface irregularity information writing means having a second probe being relatively movable along a surface of a substrate to be processed, said surface irregularity information writing means is adapted to relatively move the second probe along the surface of the substrate to be processed and to apply an electric voltage, in accordance with the surface irregularity information of the planar plate, to between the second probe and the surface of the substrate, so that a pattern corresponding to the surface irregularity pattern of the planar plate can be formed on the surface of the substrate.

In accordance with another aspect of the present invention, there is provided a fine pattern forming apparatus, comprising: surface irregularity information reading means for detecting a shape signal corresponding to a surface irregularity of a surface of an original, while scanning the surface by use of a first probe; and surface irregularity information writing means for processing a substrate to be processed, while scanning a surface of the substrate by use of a second probe; wherein an applied electric voltage to the second probe is changed in accordance with the shape signal while a distance between the second probe and the substrate is kept substantially constant, or the distance between the second probe and the substrate is changed in accordance with the shape signal while the applied electric voltage to the second probe is kept substantially constant, such that the substrate is processed in accordance with the surface irregularity of the original.

In accordance with a further aspect of the present invention, there is provided a fine pattern inspecting apparatus, comprising: first surface irregularity information reading means having a first probe being relatively movable along a surface of a first substrate having a pattern defined by a surface irregularity, said first surface irregularity information reading means being adapted to detect surface irregularity information of the surface of the first substrate on the basis of displacement of the first probe as the same is relatively moved relative to the first substrate; and second surface irregularity information reading means having a second probe being relatively movable along a surface of a second substrate having a pattern defined by a surface irregularity, said second surface irregularity information reading means being adapted to detect surface irregularity information of the surface of the second substrate on the basis of displacement of the second probe as the same is relatively moved relative to the second substrate; and comparing means for comparing the surface irregularity information read by said first surface irregularity information reading means and the surface irregularity information read by said second surface irregularity information reading means, with each other.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

[Embodiment 1]

Figure 1A:
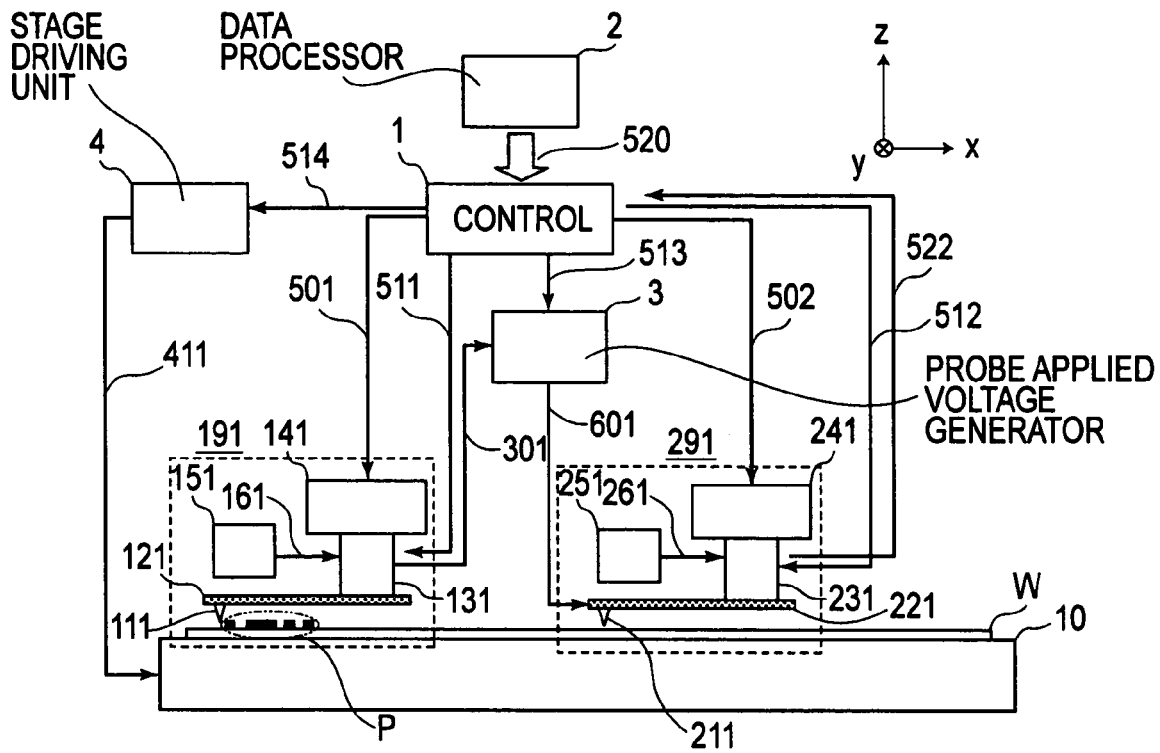
FIG. 1A is a schematic and diagrammatic view of a general structure of a fine pattern forming apparatus according to a first embodiment of the present invention.

FIG. 1A shows a general structure of a fine pattern forming apparatus according to a first embodiment of the present invention. In FIG. 1A, denoted at 121 is a cantilever having an electrically conductive first probe 111. The cantilever 121 is held by a probe Z driving mechanism 131 having a function for moving the first probe 111 toward and away from the surface of a wafer W. Denoted at 141 is a probe X-Y moving mechanism for moving the first probe 111 as well as the probe Z driving mechanism 131 along the surface of the wafer W. Denoted at 151 is a cantilever displacement detecting system for detecting any flexure of the cantilever. It comprises, as an example, a laser light projecting unit for projecting laser light to the cantilever and a sensor for receiving reflection light from the cantilever. The cantilever displacement detecting system 151 functions to feedback a cantilever displacement signal 161 to the probe Z driving mechanism 131.

Denoted at 221 is another cantilever having an electrically conductive second probe 211. The cantilever 221 is held by another probe Z driving mechanism 231 having a function for moving the second probe 211 toward and away from the surface of a wafer W. Denoted at 241 is another probe X-Y moving mechanism for moving the second probe 211 as well as the probe Z driving mechanism 231 along the surface of the wafer W. Denoted at 251 is another cantilever displacement detecting system for detecting any flexure of the cantilever. Like the cantilever displacement detecting system 151, the cantilever displacement detecting system 251 functions to feedback a cantilever displacement signal 261 to the probe Z driving mechanism 231.

Denoted at 301 is pattern surface irregularity information that corresponds to a change in command signal applied to the probe Z driving mechanism 131 as the cantilever displacement signal 161 of the cantilever displacement detecting system 151 is fed back to the probe Z driving mechanism 131 to assure that the atomic force acting between the substrate W and the first probe 111 becomes constant (i.e., the distance between the substrate W and the first probe 111 becomes substantially constant). In other words, this corresponds to the surface irregularity information of a pattern P of the substrate W. Denoted at 501 and 502 are probe X and Y movement commands to be applied to the probe moving mechanisms 141 and 142, respectively. Denoted at 511 and 512 are probe Z driving commands to be applied to the probe Z driving mechanisms 131 and 231, respectively. Denoted at 522 is a probe Z driving amount monitor signal to be fed back to a control system 1, for monitoring the motion of the probe Z driving mechanism 231. Denoted at 601 is a probe applied voltage to be applied to the second probe 211 from a probe applied voltage generator 3. Here, regarding the pattern surface irregularity information mentioned above, it may be detected (calculated) by measuring the atomic force acting between the first probe and the substrate W and, on the basis of the result of measurement, by subsequently detecting the distance between the first probe and the substrate. Furthermore, the pattern forming apparatus of this embodiment may operate to perform the processing of the substrate W while changing the distance between the second probe and the substrate W in accordance with the surface irregularity information of the pattern. Alternatively, while the distance between the second probe and the substrate W may be kept substantially constant, the electric voltage to be applied to the second probe may be changed in accordance with the pattern surface irregularity information, to process the substrate W.

Denoted at 1 is a control system for generally controlling the pattern forming apparatus. Denoted at 2 is a processing data calculating unit for calculating an applied voltage corresponding to the position of the probe and the stage, on the basis of pattern data in the transfer region. The result of calculation is transmitted to the control system 1 as processing data 520. Denoted at 3 is a probe applied voltage generator for generating an electric voltage to be applied to the probe 211 in accordance with the pattern surface irregularity information 301 or a probe voltage applying command 513 from the control system 1. Denoted at 4 is a stage driving unit for producing a driver output 411 for driving the stage in accordance with a stage driving command 514 from the control system 1. Denoted at 10 is a stage for carrying a wafer W thereon and being movable in X and Y directions. In FIG. 1, the components surrounded by a broken line, that is, probe, cantilever, probe Z driving mechanism, probe X and Y moving mechanism, and cantilever displacement detecting unit, will hereinafter be called "probe unit". Thus, the apparatus includes a first probe unit 191 and a second probe unit 291 as illustrated.

Figure 2A:
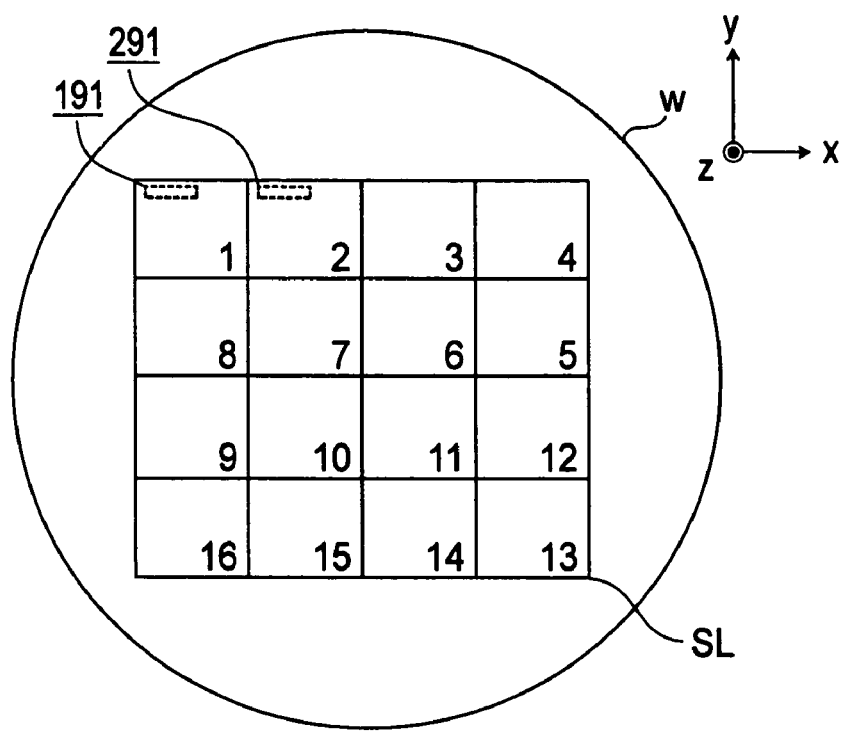
FIG. 2A is a schematic view for explaining the layout of transfer regions on a wafer in the first embodiment of the present invention.
Figure 2B:
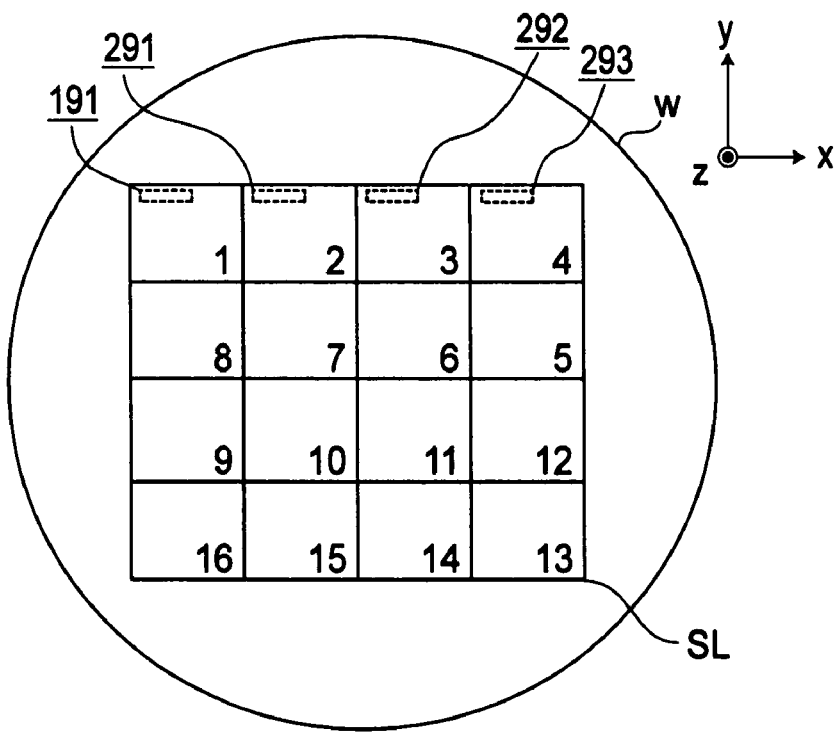
FIG. 2B is a schematic view for explaining the layout of transfer regions on a wafer in the modified example of the first embodiment of the present invention.

Referring to FIGS. 2A and 2B, the operation and function of the apparatus having the structure such as described above will be explained. FIG. 2A illustrates the layout of transfer regions on a wafer, in the first embodiment of the present invention. Here, the region #1 shown in FIG. 2A has a pattern (corresponding to the pattern P in FIG. 1A) that has already been formed thereon by the second probe 211 on the basis of processing data corresponding to one chip, as produced by the processing data calculating means 2. Alternatively, the pattern may be one formed by use of a separate processing apparatus.

In FIG. 1A, both of the probe X-Y moving mechanisms 141 and 241 for the first and second probes 111 and 211, respectively, are supported by one and the same supporting member (not shown) that is separate from the stage 10.

In operation, first, as shown in FIG. 2A, the control system 1 operates to drive the stage 10 and the probe X-Y moving mechanisms 141 and 241 to move the first probe unit 191 to an outermost corner position in the region #1 where a pattern is present and also to move the second probe unit 291 to a corresponding position in the region #2 where no pattern is formed. Subsequently, two probes 111 and 211 are moved by using the respective probe Z driving mechanisms 131 and 231, to close to the wafer W surface. Then, feedback control of the probe Z driving mechanisms 131 and 231 based on the respective cantilever displacement signals 161 and 261 from the cantilever displacement detecting units 151 and 251 is initiated to assure that the atomic force between the probes and the wafer W becomes constant.

Subsequently, the probe X-Y moving mechanisms 141 and 241 are driving synchronously in the same direction so that the region #1 is scanned by the first probe 11 while the region #2 is scanned by the second probe 211. Here, regarding the first probe, the position thereof in Z direction changes on the basis of the feedback control described above and in accordance with the surface irregularity (surface step) of the pattern having already been formed in the region #1. The change in the Z-direction position is applied to the probe applied voltage generator 3 as pattern surface irregularity information 301. In accordance with the thus inputted pattern surface irregularity information 301, the probe applied voltage generator 3 generates a probe applied voltage 601 to be applied to the second probe 211. As a result of this, the pattern information of the region 1 read by the first probe is written on the second region 2 by means of the second probe. Here, in order to form (reproduce) the surface irregularity shape having been read by the first probe, upon the substrate to be processed, the electric voltage to be applied to the second probe may be changed in accordance with the pattern surface irregularity information (this may include simply turning on and off the voltage). Alternatively, while the voltage applied to the second probe is kept constant, the distance between the second probe and the substrate to be processed may be changed in accordance with the pattern surface irregularity information. Furthermore, the substrate should desirably be processed by using the second probe in accordance with the same method as the surface irregularity information (shape information) is read by using the first probe. In that occasion, a signal (electric signal or the like) obtained by using the first probe may be used directly in the processing using the second probe. The signal detected there may be amplified or, alternatively, attenuated.

Where each of the probe X-Y moving mechanisms 141 and 241 comprises a combination of a coarse-movement unit and a fine-movement unit (not shown) and if the stage motion is used to replace the coarse-movement unit, the reading operation and the writing operation is interrupted as the probe comes to the end of the stroke of the fine-motion unit, and the probes are once retracted away from the wafer W surface by means of the probe Z driving mechanisms 131 and 231. After that, the stage 10 is moved in a direction opposite to the probe movement direction, by an amount corresponding to the stroke of the fine-motion unit. Subsequently, the probes 111 and 211 are moved by the fine-motion units of the probe X-Y moving mechanisms 141 and 214 back to the positions before the interruption. After that, the probes are moved to close to the wafer W surface by means of the probe Z driving mechanisms 131 and 231. Then, in a similar manner as described above, the two probes are used to perform the scan and the pattern reading and the pattern writing are resumed. The procedure described above is carried out with respect to the whole of the region #1, by which the pattern of the region #1 is transferred to the region #2. Here, only the stage 10 may be moved while the probe X-Y moving mechanisms 141 and 241 are held fixed, to perform the scan with the two probes. In that occasion, as the scanning probe comes up to the end of the transfer region, the probe may be once retracted away from the wafer surface and, after the stage is moved to a subsequent scan line, the probe may be returned to the wafer surface.

Next, for pattern transfer to a region #3, the probe X-Y moving mechanisms 141 and 241 operates to move the first probe to the region #2 and to move the second probe to a corresponding position in the region #3. Alternatively, while keeping the positional relationship between the two probes, the stage 10 is moved so that the first probe comes to an outermost corner of the region 2 where a pattern is present. The subsequent procedure is similar to what described above. That is, while scanning the wafer surface with the two probes moved synchronously, the surface irregularity information of the pattern transferred to the region #2 is read by using the first probe 111, and a corresponding pattern is written in the region 3 by using the second probe 211. Pattern writing in a region #4 may be carried out similarly. Where a pattern is going to be transferred in a region #8, the first probe 111 is moved again to the region #1 while and the second probe 211 is moved to the region #8, and the above-described transfer operation is repeated. The pattern transfer to regions #7, #6 and #5 may be carried out in a similar manner as the pattern transfer to the regions #2, #3 and #4. Here, the first probe may be used only for the scan of the region #1 and the pattern writing of all the remaining regions may be carried out by using the second probe. Anyway, in the manner described above, pattern is transferred to the transfer regions one by one, and then the pattern transfer to all the transfer regions of the wafer W is completed. Here, for the pattern transfer, the two probes may not be moved synchronously. That is, the first probe may be used to read pattern surface irregularity information at a predetermined distance and, after that, the second probe may be used to perform the writing, and this procedure may be repeated to complete the pattern transfer. Furthermore, a pattern having been transferred to the wafer may be scanned without applying a voltage to the second probe 211, and in that occasion, the surface irregularity information concerning the transferred pattern is obtainable from the probe Z driving amount monitor signal 522. By comparing this with the processing data described hereinbefore by using the control system 1, the state of pattern transfer can be checked.

Figure 1B:
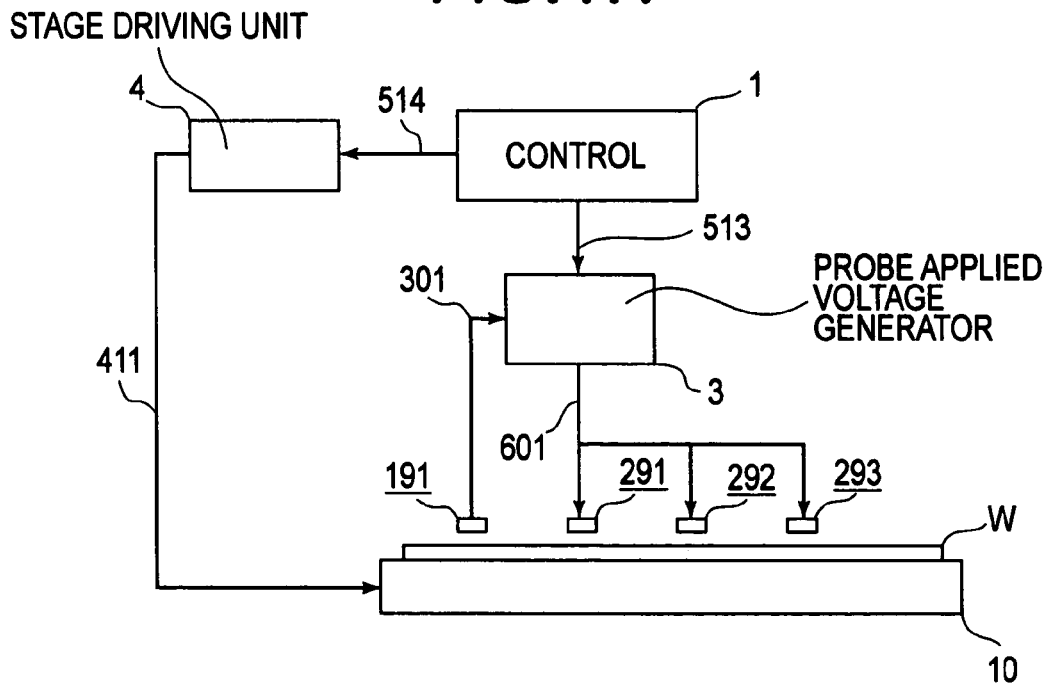
FIG. 1B is a schematic and diagrammatic view of a general structure of a fine pattern forming apparatus according to a modified example of the first embodiment of the present invention.

FIG. 1B and FIG. 2B show a case where the apparatus has a plurality of second probe units. More specifically, probe units 291, 292 and 293 include three second probes and, in association with these second probes, each probe unit includes a probe Z driving mechanisms, a probe X-Y moving mechanisms, and a cantilever displacement detecting units such as shown in the probe unit 291 of FIG. 1A. A probe applied voltage is applied to each of the second probes from the probe applied voltage generator 3. In this example, the second probes may be scanningly moved in synchronism with the first probe and, through the control such as described hereinbefore, the pattern of the region #1 can be transferred to the regions #2, #3 and #4 simultaneously. Furthermore, the pattern may be transferred first to the regions #8, #9 and #16 in the manner described with reference to FIG. 2A and subsequently the pattern may be transferred to the remaining regions in the manner of FIG. 2B. This enables an increase of throughput.

In accordance with the first embodiment as described above, only pattern data corresponding to one region (region #1) is necessary. Hence, the processing time necessary for converting the pattern data into processing data such as probe position or applied voltage can be reduced remarkably. Moreover, use of huge memory or the like for storing data before the conversion and data after the conversion becomes unnecessary.

In the foregoing description, although the first probe is used for reading while the second probe is used for writing, this is merely for convenience of explanation. Both probes may have reading and writing functions.

[Embodiment 2]

Figure 3:
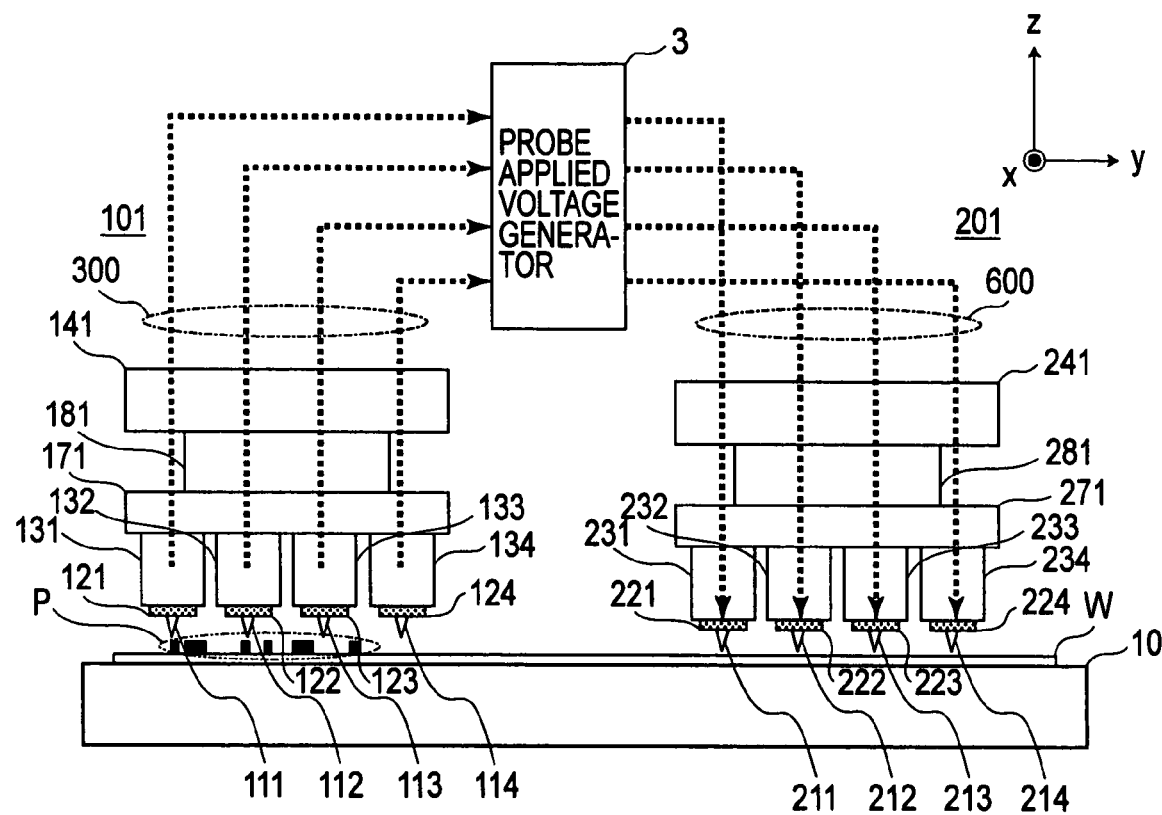
FIG. 3 is a schematic and diagrammatic view for explaining the structure of a portion of a fine pattern forming apparatus according to a second embodiment of the present invention.

FIG. 3 is a schematic view showing the structure of a portion of a fine pattern forming apparatus according to a second embodiment of the present invention. This embodiment differs from the first embodiment in that there are plural first probes and plural second probes and that it has a multi-probe structure wherein each unit of probes of a predetermined number is held by a holder. In FIG. 3, there are cantilevers 121–124 having first probes 111–114 which are held by a holder 171 through individual probe Z driving mechanisms 131–134. The holder 171 is held by a head X-Y moving mechanism 141 through a holder Z driving mechanism 181. Hereinafter, these components will be called "reading head 101". Furthermore, there are cantilevers 221–224 having second probes 211–214 which are held by another holder 271 through individual probe Z driving mechanisms 231–234. The holder 271 is held by a head X-Y moving mechanism 241 through a holder Z driving mechanism 281. Hereinafter, these components will be called "writing head 201". The apparatus further comprises cantilever displacement detecting means for detecting displacements of the cantilevers, respectively, although they are not illustrated in FIG. 3.

Denoted generally at 300 are plural pattern surface irregularity information which are obtainable from the driving amounts of the respective probe Z driving mechanisms for the first probes. Denoted generally at 600 are probe applied voltages for the second probes, generated by the probe applied voltage generator 3 in accordance with the corresponding pattern surface irregularity information 300. The relative position of the first probes 111–114 and the relative position of the second probes 211–214 are even. For example, the spacing of the first probes and the spacing of the second probes may be made equal to each other.

In the structure described above, the movement of each probe toward and away from the wafer W surface is carried out by using the holder Z driving mechanism 181 or 281. The control for keeping the atomic force between each probe and the wafer surface is carried out by using corresponding one of the probe Z driving mechanisms 131–134 and 231–234. As regards the pattern transfer, like the first embodiment the surface irregularity information of the pattern P having been read by using the first probes 111–114 during synchronous scan of the head X-Y moving mechanisms 141 and 241 or during movement of the stage 10 are written in separate transfer regions by using the second probes 211–214. In this manner, the pattern data to be written simultaneously increases in proportion to the number of probes and, thus, the throughput can be improved.

Furthermore, like the case of FIG. 2B wherein a plurality of second probes are provided to perform the writing, a plurality of writing heads 201 may be provided to perform the writing in separate transfer regions simultaneously. This enables further increase of throughput. Moreover, like the first embodiment, the two heads may not be scanned synchronously but rather, after the pattern surface irregularity information is read by using the reading head, the writing head may operate to perform the writing and, by repeating this, the pattern transfer may be completed.

In the foregoing description, although the first probe is used for reading while the second probe is used for writing, this is merely for convenience of explanation. Both probes may have reading and writing functions.

[Embodiment 3]

Figure 4:
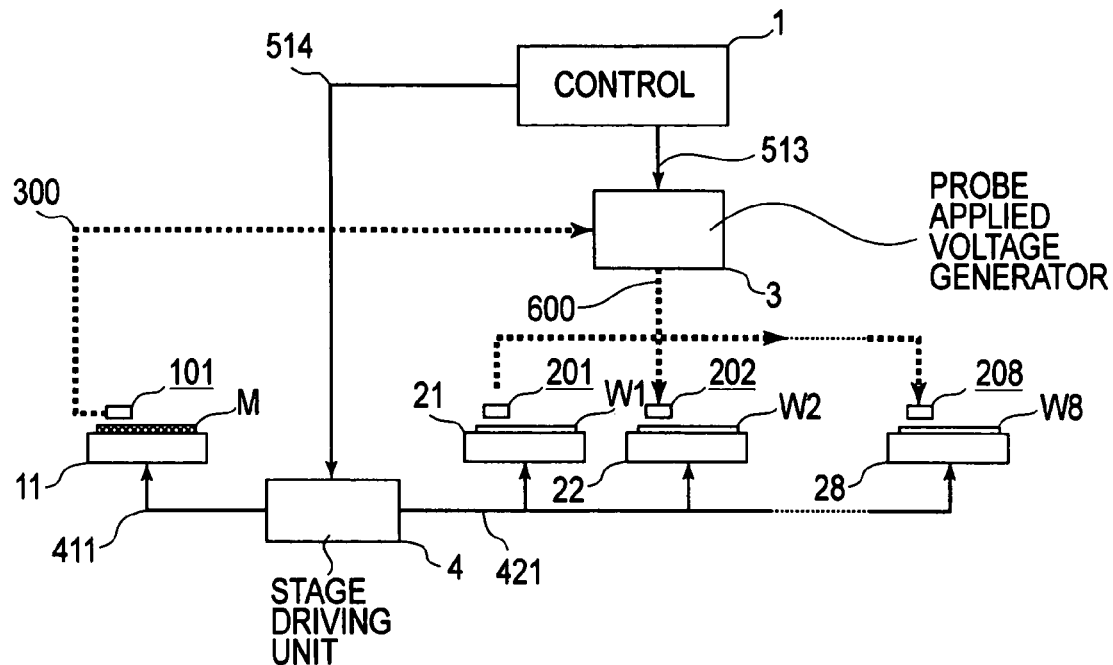
FIG. 4 is a schematic and diagrammatic view for explaining the structure of a portion of a fine pattern forming apparatus according to a third embodiment of the present invention.

FIG. 4 is a schematic view showing the structure of a portion of a fine pattern forming apparatus according to a third embodiment of the present invention. This embodiment differs from the second embodiment in that there are a plurality of stages for carrying thereon substrates to be processed, and also that there are a plurality of corresponding writing heads. In FIG. 4, denoted at M is an original (which may be referred to as a reticle or a mask) having a pattern P formed on the whole surface (whole transfer region) thereof. Denoted at W1–W9 are wafers to which the pattern of the original is to be transferred. Denoted at 11 and 21–28 are stages on which the original or the wafers are placed. These stages are driven in response to driver outputs 411 and 421 supplied from a stage driving unit 4. Denoted at 101 is a reading head, and denoted at 201–208 are writing heads. Denoted generally at 300 is pattern surface irregularity information of the original which is obtainable by controlling plural first probes of the reading head as has been described with reference to FIG. 3, so that the atomic force acting between the surface of the original and the first probes becomes constant. Denoted generally at 600 is probe applied voltage generated by the probe applied voltage generator 3 and being applied to each second probe of the plural writing heads, corresponding to associated one of the first probes of the reading head.

In the structure described above, the pattern transfer is carried out as follows. First of all, the stage 11 and the head X-Y moving mechanism (corresponding to the element shown at 141 in FIG. 3) of the reading head 101 are driven so that the reading head 101 comes to a predetermined position (e.g. region #1) on the original M. Similarly, the stages 21–28 and the head X-Y moving mechanisms 241–248 (not shown) are driven so that the writing heads 201–208 come to corresponding positions (e.g. region #1) on the substrates W1–W8, respectively. Subsequently, the holder Z driving mechanism (corresponding to the element shown at 181 in FIG. 3) of the reading head 101 is driven to move the first probes (corresponding to the elements shown at 111–114 in FIG. 3) of the reading head 101 close to the surface of the original. Thereafter, the feedback control of the probe Z driving mechanisms (at 131–134 in FIG. 3) based on corresponding cantilever displacement signals is initiated so that the atomic force between the original M and the first probes becomes constant. Similar operations are made in regard to the writing heads 201–208, and the holder Z driving mechanism of the writing heads are driven to move the second probes of the writing heads to close to the surfaces of the corresponding substrates. Thereafter, the feedback control of the probe Z driving mechanisms based on corresponding cantilever displacement signals is initiated so that the atomic force between the second probes and the corresponding substrates becomes constant. Subsequently, the head X-Y driving mechanisms of all the heads or the stages 11 and 21–28 are driven synchronously to scan the original and the substrates with the reading head 101 and the writing heads 201–208. During the scan, on the basis of the pattern surface irregularity information of the original M obtained through the first probes of the reading head 101, a probe applied voltage 600 is generated by the probe applied voltage generator 3 and it is applied to corresponding probes of the writing heads 201–208. In this manner, the pattern of the original can be transferred to plural substrates simultaneously and, therefore, the throughput can be improved largely.

The original may be a substrate having a pattern already transferred thereto. Furthermore, like the second embodiment, all the heads may not be scanned synchronously but, rather, after the pattern surface irregularity information at a predetermined distance is read by using the reading head, the pattern writing may be carried out by use of plural writing heads and, by repeating this, the pattern transfer may be completed.

[Embodiment 4]

Figure 5:
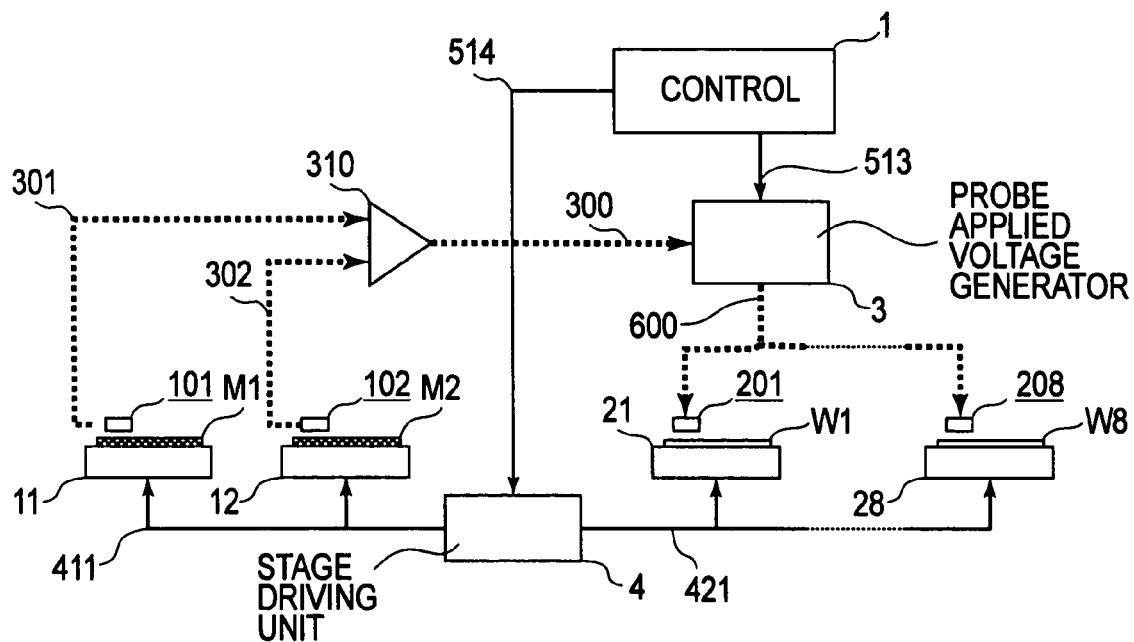
FIG. 5 is a schematic and diagrammatic view for explaining the structure of a portion of a fine pattern forming apparatus according to a fourth embodiment of the present invention.
Figure 6A:
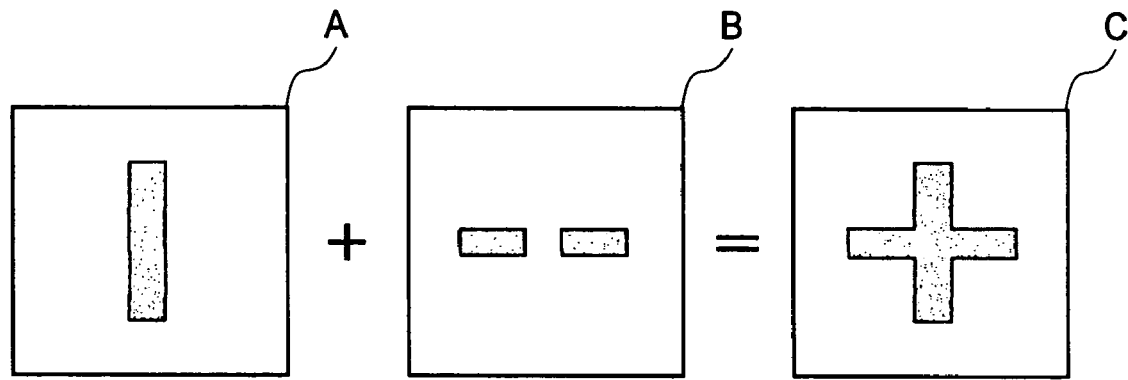
FIGS. 6A and 6B are schematic views, respectively, for explaining examples of pattern composition, in the fourth embodiment of the present invention.
Figure 6B:
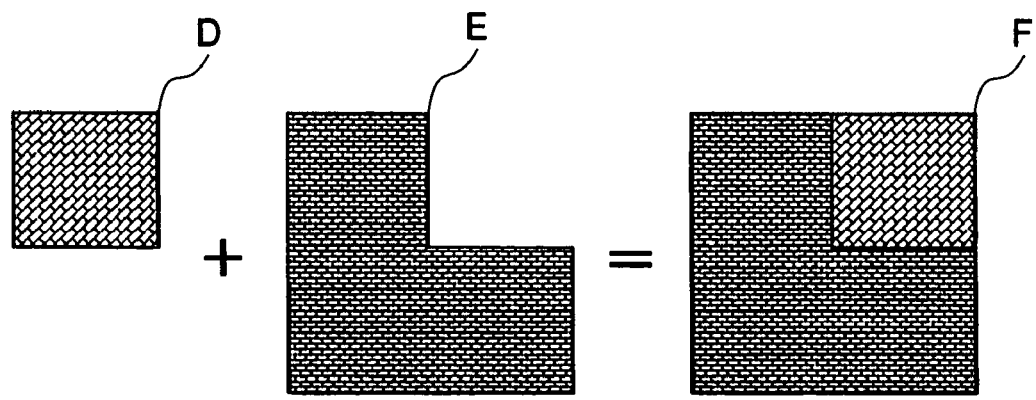

FIG. 5 is a schematic view showing the structure of a portion of a fine pattern forming apparatus according to a fourth embodiment of the present invention. FIGS. 6A and 6B are schematic views showing examples of pattern composition. This embodiment differs from the third embodiment in that there are plural originals M1 and M2 and that plural pattern surface irregularity information obtainable from these patterns are superimposed and applied to a probe applied voltage generator. In FIG. 5, denoted at 310 is an adder for adding pattern surface irregularity information 301 of the original M1 obtainable from a reading head 101 and pattern surface irregularity information 302 of the original M2 obtainable from another reading head 102 with each other, the addition being made with respect to each pair of corresponding probes of these reading heads. The results are applied to the probe applied voltage generator 3. The pattern surface irregularity information 302 of the original M2 can be obtained by moving the head X-Y driving mechanism of the reading head 102 or the stage 12 in synchronism with the head X-Y moving mechanism of the reading head 101 or the stage 11. In FIG. 6A, where the region #1 of the original M1 has a pattern A and the region #1 of the original M2 has a pattern B, as a result of the adding operation of the adder 310 of FIG. 5, a pattern such as shown at C is transferred to each region #1 of the substrates W1–W8. Furthermore, as shown in FIG. 6B, a chip (pattern D) having a special function may be prepared on the original M1 while a chip (pattern E) having common function may be prepared on the original M2, and in that occasion, a chip (pattern F) having both functions can be produced. A plurality of such originals may be prepared beforehand, and this makes it easier to transfer complicated patterns. Also, the cost per each original can be reduced.

While in the foregoing description an adder is used to superimpose two (pieces of) surface irregularity information each other to provide a composition, a subtracting device may be used in place of it. Alternatively, an adder and a subtracting device may be used in combination to compose three or more (pieces of) surface irregularity information.

[Embodiment 5]

Figure 7:
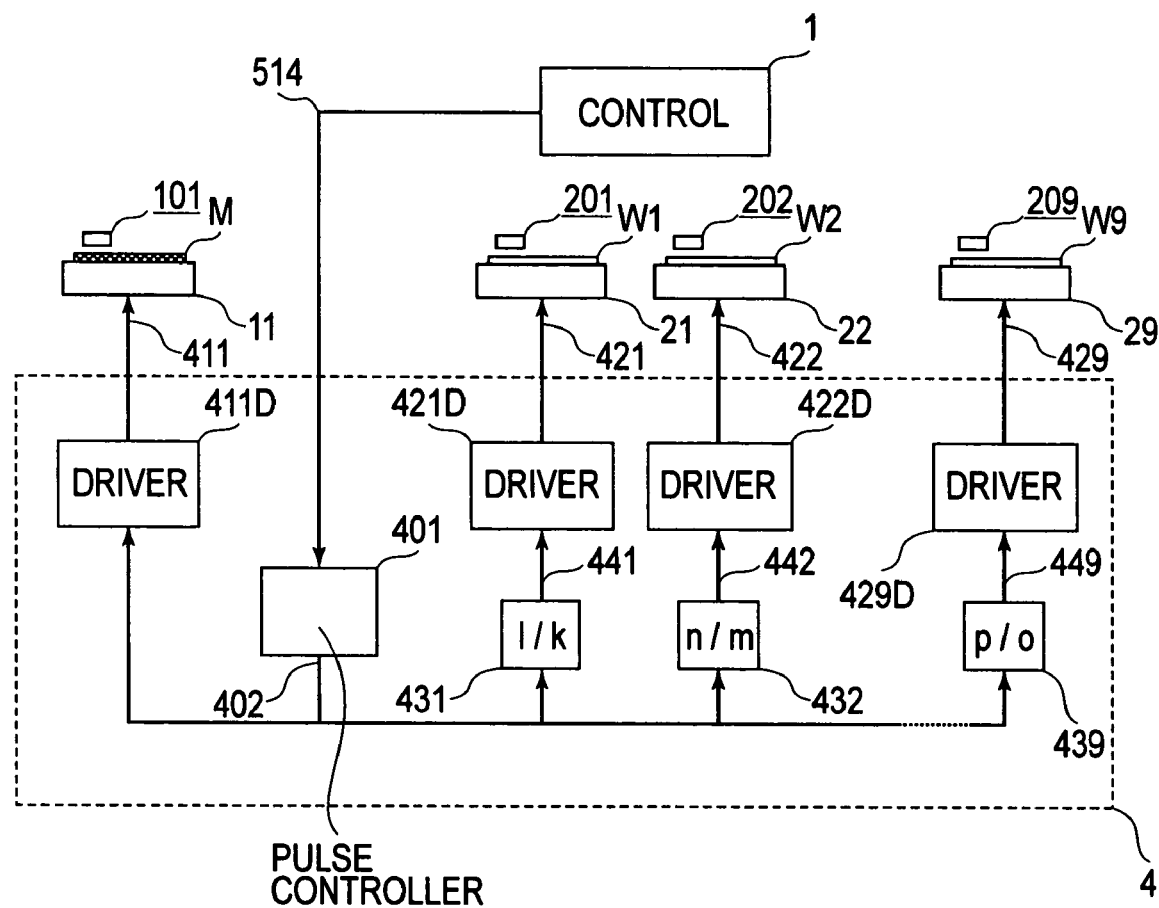
FIG. 7 is a schematic and diagrammatic view for explaining the structure of a portion of a fine pattern inspecting apparatus according to a fifth embodiment of the present invention.

FIG. 7 is a schematic view showing the structure of a portion of a fine pattern forming apparatus according to a fifth embodiment of the present invention. This embodiment differs from the third embodiment in that the driving speed of plural stages each carrying a workpiece substrate thereon is made variable. In FIG. 7, denoted at 4 is a stage driving unit such as described hereinbefore, and denoted at 401 is a pulse controller for outputting driving pulses to be applied to drivers in response to a stage driving command 514 from the control system 1. Denoted at 411D is a driver for an original stage 11, and denoted at 411 is an output thereof. Denoted at 421D–429D are drivers for substrate stages 21–29, respectively, and denoted at 421–429 are outputs of them. Denoted at 431–439 are dividing/multiplying devices having a function for transforming driving pulses 402 outputted from the pulse controller 401 into driving pulses 441, 442 and 449: more specifically, the divider/multiplier 431 multiplies the driving pulse 402 by l/k and provides a driving pulse 441; the divider/multiplier 432 multiplies the driving pulse 402 by n/m and provides a driving pulse 442; and the divider/multiplier 439 multiplies the driving pulse 402 by p/o and provides a driving pulse 441 (where k, l, m, n, o and p are arbitrary integral numbers). As a result of this, even though the stages are driven synchronously by the stage driving system 4, the moving speed of each of the stages 21–29 has a certain ratio to the speed of the stage 11. Furthermore, although not shown in the drawing, with respect to the speed of the head X-Y moving mechanism of the reading head 101, the speeds of the head X-Y moving mechanisms of the writing heads 201, 202 and 209 are set to be l/k times, n/m times, and p/o times, respectively.

When in the structure described above the pattern transfer operation such as described with reference to the third embodiment is carried out, the size of a pattern transferred to the substrate W1 is l/k times the pattern of the original M. Similarly, the sizes of the patterns transferred to the substrates W3 and W9 are n/m times and p/o times the pattern of the original M, respectively. This creates a possibility that an original is prepared with a relatively loose linewidth precision pattern, yet when transferred it is reduced into a desired linewidth precision pattern. The cost for original preparation can be reduced by it. Furthermore, various errors such as regarding process distortion, an error peculiar to a stage used, or a magnification error, can be corrected by appropriately changing the setting of the divider/multiplier devices.

Like the second embodiment, all the heads may not be scanned synchronously but rather, after pattern surface irregularity information at a predetermined distance is read by using the reading head, the data may be written by using the writing head and, by repeating this, the pattern transfer may be completed.

[Embodiment 6]

Figure 8A:
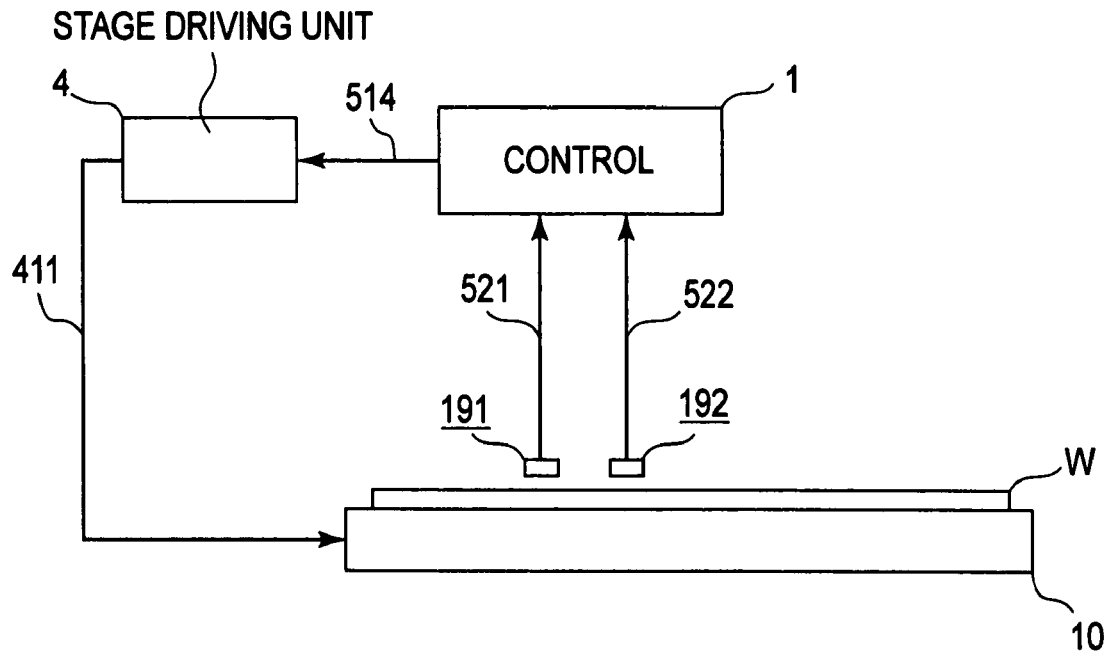
FIGS. 8A and 8B are schematic and diagrammatic views each for explaining the structure of a portion of a fine pattern inspecting apparatus according to a sixth or seventh embodiment of the present invention.

FIG. 8A is a schematic view of a general structure of a fine pattern inspecting apparatus according to a sixth embodiment of the present invention. The components having a similar function as of those shown in FIG. 1 are denoted by corresponding reference numerals. In FIG. 8A, the apparatus comprises a stage 10 on which a substrate W is placed, and two reading probe units 191 and 192. From these probe units, probe Z driving amount monitor signals 521 and 522 are outputted and they are inputted into a control system 1. In the structure described above, the reading probe units 191 and 192 are moved synchronously or, alternatively, the stage 10 is driven, so that the substrate W is scanned by the two reading probe units 191 and 192. The probe Z driving amount monitor signals 521 and 522 obtained thereby are compared with each other within the control system 1, by which the state or quality of the produced patterns in the transfer regions SL, scanned by the two reading probes, can be compared. The comparison may be made with respect to each transfer region while storing the probe Z driving amount monitor signal (surface irregularity information) in the control system, or it may be made after the scan of the entire surface of the substrate is completed. The scan may not be made synchronously, but rather the two reading probe units may be operated alternately to perform scan thorough every predetermined amount and, while the data are accumulated in the control system, the surface irregularity information of them may be compared with each other.

In the manner described above, pattern inspection or pattern evaluation can be done inside one and the same substrate, very easily.

[Embodiment 7]

Figure 8B:
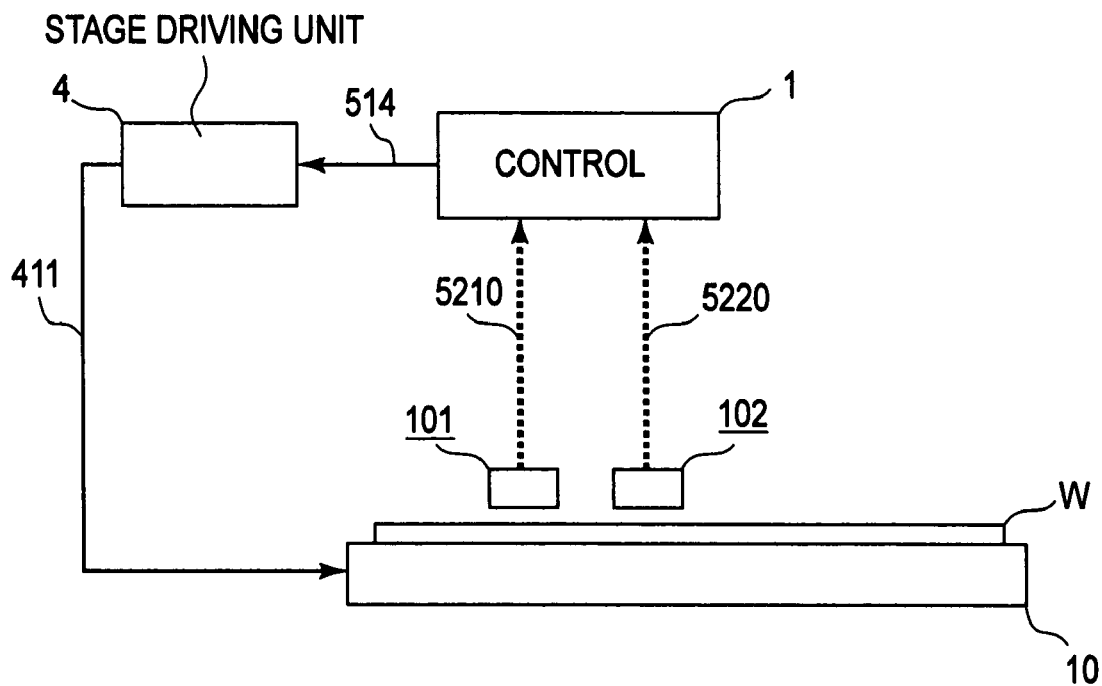

FIG. 8B is a schematic view of a general structure of a fine pattern inspecting apparatus according to a seventh embodiment of the present invention. The components having a similar function as of those shown in FIG. 1 or 3 are denoted by corresponding reference numerals. This embodiment differs from the sixth embodiment in that the reading probes are formed into a multiple reading head structure. In FIG. 8B, the apparatus comprises a stage 10 on which a substrate W is placed, and two reading heads 101 and 102. From these reading heads, probe Z driving amount monitor signals corresponding to plural probes in each head, are outputted while being combined in regard to each head as 5210 and 5220, and they are inputted into a control system 1.

In the structure described above, the reading heads 101 and 102 are moved synchronously or, alternatively, the stage 10 is driven, so that the substrate W is scanned by the two reading heads 101 and 102. The probe Z driving amount monitor signals 5210 and 5220 of corresponding probes of the two reading heads, obtained thereby, are compared with each other within the control system 1, by which the state or quality of the produced patterns in the transfer regions SL, scanned by the two reading probes, can be compared. The comparison may be made with respect to each transfer region while storing the probe Z driving amount monitor signal (surface irregularity information) in the control system, or it may be made after the scan of the entire surface of the substrate is completed. The scan may not be made synchronously, but rather the two reading probe units may be operated alternately to perform scan thorough every predetermined amount and, while the data are accumulated in the control system, the surface irregularity information of them may be compared with each other.

In the manner described above, pattern inspection or pattern evaluation can be done inside one and the same substrate, very easily. Furthermore, by using a multiple-probe reading head structure, the throughput of inspection can be improved significantly.

[Embodiment 8]

Figure 9:
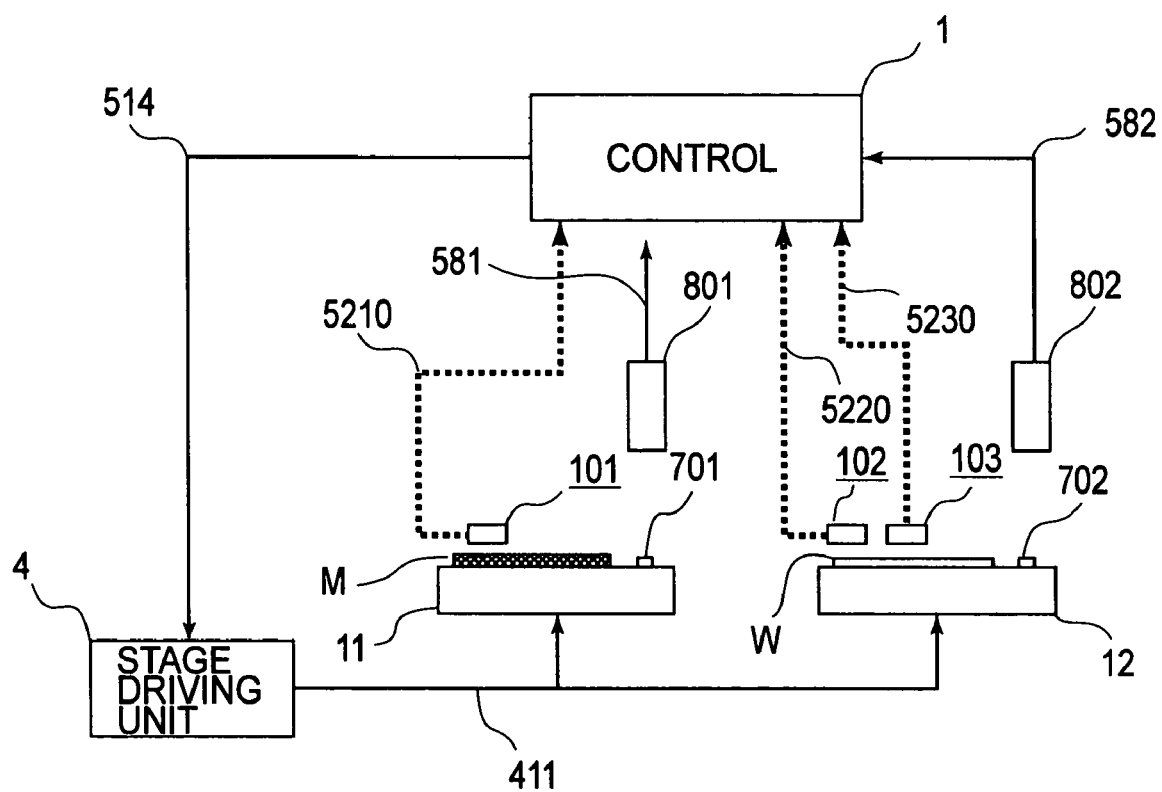
FIG. 9 is a schematic and diagrammatic view of a general structure of a fine pattern inspecting apparatus according to an eighth embodiment of the present invention.

FIG. 9 is a schematic view of a general structure of a fine pattern inspecting apparatus according to an eighth embodiment of the present invention. The components having a similar function as of those shown in FIG. 1, 3 or 4 are denoted by corresponding reference numerals. In FIG. 9, the apparatus comprises three reading heads 101–103 and two stages 11 and 12. From the three reading heads, like the seventh embodiment, probe Z driving amount monitor signals corresponding to plural probes in each head, are outputted while being combined in regard to each head as 5210–5230, and they are inputted into a control system 1. An original M is placed on the stage 11, and a substrate W having a pattern already transferred from the original M is placed on the stage 12. Denoted at 701 and 702 are reference marks which are provided on the stages 11 and 12, respectively. Denoted at 801 and 802 are reference mark measuring optical systems for measuring a deviation of the reference marks, and they are fixed to a reference surface (not shown) of the inspection apparatus. Every time the stage is initialized, the reference marks are measured by using the reference mark measuring optical systems, and a deviation amount from an initialization origin is measured. When the control system 1 applies a stage driving command 514 to the stage driving system 4, such deviation amount (581 or 582) is taken into account. With this procedure, the coordinate origins of plural stages can be registered with respect to the same apparatus reference. The correction of initialization origin deviation using reference marks may be applied to the fine pattern forming apparatuses of the first to fifth embodiments and to the fine pattern inspecting apparatuses of the sixth and seventh embodiments, with similar advantageous effects.

The reference mark may be a pattern having surface irregularity. In that occasion, the deviation amount can be measured by using the reading heads 101 and 102 (103).

In the structure described above, the operation as an inspecting apparatus is as follows. The reading heads 101 and 102 (103) or, alternatively, the two stages 11 and 12 are moved synchronously, so that the original and the substrate are scanned by the reading heads 101 and 102 (103). The probe Z driving amount monitor signals 5210 and 5220 (5230) obtained thereby are compared with each other within the control system 1, by which whether or not the pattern of the original has been correctly transferred to the substrate can be checked. The comparison may be made with respect to each transfer region while storing the probe Z driving amount monitor signal (surface irregularity information) in the control system, or it may be made after the scan of the entire surface of the substrate is completed. The original may be a separate substrate having a pattern already transferred thereto. In that occasion, two substrates having transferred patterns can be compared with each other. The scan may not be made synchronously, but rather the two reading heads may be operated alternately to perform scan thorough every predetermined amount and, while the data are accumulated in the control system, the surface irregularity information of them may be compared with each other. Furthermore, the surface irregularity information obtained by scanning the original M may be first stored in the control system, and subsequently it may be compared with the surface irregularity information obtainable by scanning the substrate W. In that occasion, for subsequent inspection, placement of the original M on the stage 11 becomes unnecessary. Additionally, the stage 11 can be used for inspection of another substrate W. As a further alternative, identical patterns formed at different positions on the same substrate W, placed on the stage 12, may be scanned by the reading heads 102 and 103. This enables comparison of pattern surface irregularity information inside one and the same substrate. Furthermore, in place of the reading head 101, a plurality of reading heads for reading plural originals such as shown in FIG. 5 may be used, and the information obtainable as a composite of the outputs of these reading heads may be compared with the read information of the reading heads 102 and 103.

In accordance with the embodiments of the present invention having been described above, in a fine pattern forming apparatus having a scanning probe microscope for drawing a circuit pattern of semiconductor device, the surface irregularity information of a pattern having been transferred to one portion (region) of a wafer is read and, simultaneously therewith, the same surface irregularity information is written onto another region of the same wafer. This avoids the necessity of preparing huge amount of processing data such as writing probe position or probe applied voltage, for example. Only necessary is data corresponding to one chip, for example. As a result, the tine required for converting the pattern data to the processing data can be shortened considerably, and adverse influence of the data conversion process to the pattern drawing throughput can be avoided.

The apparatus may use a plurality of writing probes to enable simultaneous writing on plural transfer regions. The pattern drawing throughput can be made very high.

The apparatus may comprise a reading head having plural reading probes disposed along a planar plane and a writing head having plural writing probes disposed along a planar plane, and these heads may be scanned synchronously. This enables notable expansion of the transfer region to be drawn simultaneously, and makes the throughput very high.

The apparatus may comprise a stage on which an original is placed and a stage on which a workpiece substrate to be processed is placed, wherein the original may be scanned by a reading head and the substrate may be scanned by a writing head synchronously. This avoids the necessity of pattern data itself, and removes the necessity of using data converting means for converting data into processing data as well as data storing means for storing the same. The structure of the apparatus can be made vary simple. Furthermore, a workpiece substrate having a pattern already transferred thereto may be used as an original. This effectively decreases the cost of original preparation.

The apparatus may comprise a plurality of stages each for carrying a workpiece substrate thereon. This enables transferring a pattern to plural workpiece substrates simultaneously, and thus the throughput can be improved considerably.

The apparatus may comprise a plurality of stages each for carrying an original thereon, and separate pattern information obtainable by scanning the originals by using separate reading heads may be combined and supplied to a writing head as an applied voltage. In that occasion, even a complicated pattern can be prepared by dividing the same into separate originals. Thus, the original preparation cost can be decreased effectively.

The scan speeds of the reading head and the writing head may have a certain ratio. This enables reduced scale pattern drawing as well as enlarged scale pattern drawing. Furthermore, it enables correction of various errors such as process distortion, an error peculiar to a stage used, a magnification error and the like. Since the reduced scale pattern drawing can be done, the original pattern can be prepared in a magnified scale. This relieves the need for dimensional precision.

Where the present invention is applied to a fine pattern inspecting apparatus having a scanning probe microscope for pattern drawing inspection of a circuit pattern of a semiconductor device, different regions on one and the same substrate are scanned by using two reading probes or reading heads and resultant data are compared with each other. Alternatively, substrates on two stages may be scanned by two reading heads and the resultant data may directly be compared with each other. The state or quality of pattern drawing can thus be checked quickly and easily.

[Embodiment 9]

Next, an embodiment of a device manufacturing method which uses a fine pattern forming apparatus according to any one of the embodiments described above, will be explained.

Figure 10:
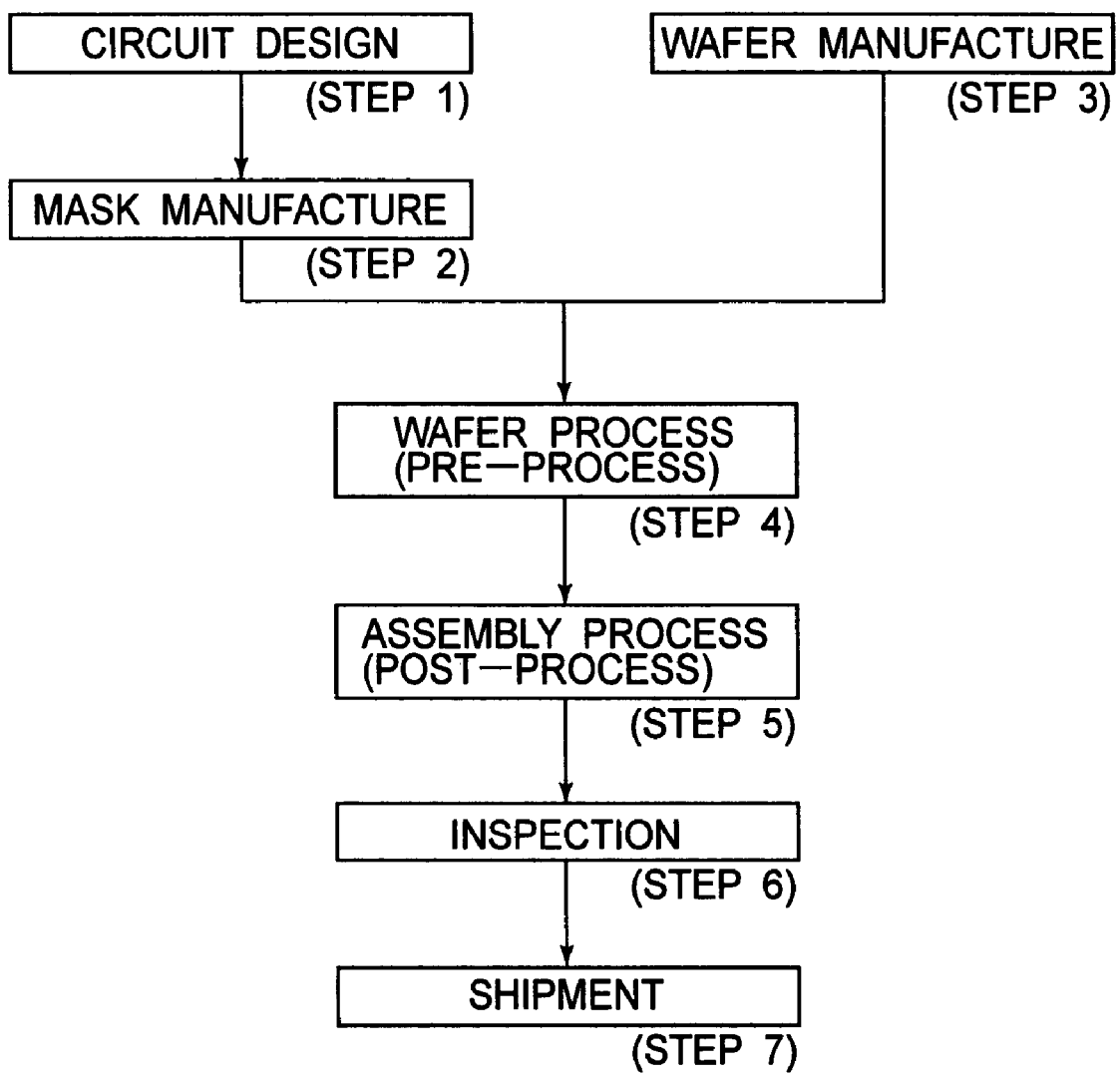
FIG. 10 is a flow chart for explaining the procedure of device manufacturing processes.

FIG. 10 is a flow chart for explaining the overall procedure for manufacture of microdevices such as semiconductor chips (ICs or LSIs), liquid crystal panels, CCDs, thin magnetic heads, micromachines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

More specifically, the wafer process at step 4 described above includes: (i) an oxidation process for oxidizing the surface of a wafer; (ii) a CVD process for forming an insulating film on the wafer surface; (iii) an electrode forming process for forming electrodes upon the wafer by vapor deposition; (iv) an ion implanting process for implanting ions to the wafer; (v) a resist process for applying a resist (photosensitive material) to the wafer; (vi) an exposure process for printing, by exposure, the circuit pattern of the mask on the wafer through the exposure apparatus described above; (vii) a developing process for developing the exposed wafer; (viii) an etching process for removing portions other than the developed resist image; and (ix) a resist separation process for separating the resist material remaining on the wafer after being subjected to the etching process. By repeating these processes, circuit patterns are superposedly formed on the wafer.

As a matter of course, the embodiments of the present invention having been described above may be used in combination appropriately, as long as contradiction is not caused thereby.

In accordance with a fine pattern forming apparatus of an embodiment of the present invention wherein a scanning probe microscope is used for pattern drawing of a circuit pattern of a semiconductor device, the surface irregularity information of a pattern which is going to be written onto a substrate to be processed is read from a pattern having already been formed, and an electric voltage to be applied to between a writing probe and the substrate to be processed is determined on the basis of the thus read surface irregularity information. This avoids the necessity of preparing enormous processing data such as writing probe position or probe applied voltage, for example. Thus, the time required for calculating the probe applied voltage can be shortened significantly. Hence, without decreasing the processing speed, the required memory capacity can be reduced.

Furthermore, in accordance with a fine pattern inspecting apparatus of an embodiment of the present invention wherein a scanning probe microscope is used for pattern drawing inspection of a circuit pattern of a semiconductor device, two (pieces of) surface irregularity information of two patterns defined by a surface irregularity (step) are read and then are compared with each other. Thus, the result of pattern drawing can be checked quickly and easily.

The apparatus may comprise two reading heads for scanning substrates on two stages synchronously, and data from these reading heads may be directly compared with each other. This enables further shortening of the time for inspection and yet it facilitates the inspection.

The present invention can be embodied in various forms, and examples are as follows.

(1) A fine pattern forming apparatus, comprising a first cantilever having a first probe mounted thereon; a second cantilever having a second probe mounted thereon; probe position detecting means for detecting the positions of the first and second probes individually on the basis of motions of the first and second cantilevers; probe fine-motion means for moving the first and second probes individually toward or away from a substrate to be processed; probe moving means for moving the first and second probes individually along a plane parallel to the substrate to be processed; voltage applying means for applying an electric voltage to between the second probe and the substrate to be processed; a stage for carrying thereon the substrate to be processed; stage driving means for moving the stage in a direction along the same plane as the surface of the substrate to be processed; processing data calculating means for calculating the position of the second probe on the substrate to be processed as well as an applied voltage required therefor, on the basis of data of a pattern to be produced on the substrate; and control means for controlling the probe fine-motion means, the probe moving means, the voltage applying means, the stage driving means and the processing data calculating means, wherein a change in the position of the first probe as the first and second probes are relatively moved relative to the substrate and along the surface of the substrate by use of the probe moving means or the stage driving means, is detected by use of the probe position detecting means, and wherein the voltage applied to the second probe by the voltage applying means is changed in accordance with the output of the probe position detecting means, whereby a pattern is formed on the substrate.

In accordance with the form of the present invention as recited in item (1), in a fine pattern forming apparatus having a scanning probe microscope for drawing a circuit pattern of semiconductor device, the surface irregularity information of a pattern having been transferred to one portion (region) of a wafer is read and, simultaneously therewith, the same surface irregularity information is written onto another region of the same wafer. This avoids the necessity of preparing huge amount of processing data such as writing probe position or probe applied voltage, for example. Only necessary is data corresponding to one chip, for example. As a result, the tine required for converting the pattern data to the processing data can be shortened considerably, and adverse influence of the data conversion process to the pattern drawing throughput can be avoided.

(2) A fine pattern forming apparatus as recited in item (1), wherein relative movements of the first and second probes relative to the substrate to be processed are made synchronously.

(3) A fine pattern forming apparatus as recited in item (1), wherein the apparatus comprises a plurality of probes each being the second probe as aforesaid, and wherein the voltage applying means applies electric voltages to the second probes individually to form a plurality of same patterns simultaneously.

(4) A fine pattern forming apparatus, comprising a plurality of cantilevers each having a probe mounted thereon; probe position detecting means for detecting the positions of the probes individually on the basis of motions of the plurality of cantilevers, respectively; probe fine-motion means for moving the probes individually toward or away from a substrate to be processed; first and second probe heads each being adapted to hold a predetermined number of probes, out of the aforementioned probes, along a plane; probe head fine-motion means for moving the first and second probe heads individually toward and away from the substrate to be processed; probe head moving means for moving the first and second probe heads individually along a plane parallel to the substrate to be processed; voltage applying means for applying an electric voltage to between the probes of the second probe head and the substrate to be processed; a stage for carrying thereon the substrate to be processed; stage driving means for moving the stage in a direction along the same plane as the surface of the substrate to be processed; processing data calculating means for calculating the position of the second probe head upon the substrate to be processed as well as an applied voltage required with respect to each probe of the second probe head, on the basis of data of a pattern to be produced on the substrate; and control means for controlling the probe fine-motion means, the probe head fine-motion means, the probe head moving means, the voltage applying means, the stage driving means and the processing data calculating means, wherein a change in the position of each probe of the first probe head as the first and second probe heads are relatively moved relative to the substrate and along the surface of the substrate by use of the probe head moving means or the stage driving means, is detected by use of the probe position detecting means, and wherein the voltages applied to corresponding probes of the second probe head by the voltage applying means are individually changed in accordance with the output of the probe position detecting means, whereby a pattern is formed on the substrate.

In accordance with the form of the present invention as recited in item (4) above, the apparatus uses a plurality of writing probes to enable simultaneous writing on plural transfer regions. The pattern drawing throughput can be made very high. Further, the apparatus comprises a reading head having plural reading probes disposed along a planar plane and a writing head having plural writing probes disposed along a planar plane, and these heads are scanned synchronously. This enables notable expansion of the transfer region to be drawn simultaneously, and makes the throughput very high.

(5) A fine pattern forming apparatus as recited in item (4), wherein relative movements of the first and second probe heads relative to the substrate to be processed are made synchronously.

(6) A fine pattern forming apparatus as recited in item (4), wherein the apparatus includes a plurality of probe heads each being the second probe head, and wherein the voltage applying means applies electric voltages to the second probe heads individually to form a plurality of same patterns simultaneously.

(7) A fine pattern forming apparatus, comprising a first cantilever having a first probe mounted thereon; a second cantilever having a second probe mounted thereon; probe position detecting means for detecting the positions of the first and second probes individually on the basis of motions of the first and second cantilevers; a first stage for carrying thereon a first substrate; a second stage for carrying thereon a second substrate; probe fine-motion means for moving the first and second probes individually toward or away from the first and second substrates, respectively; probe moving means for moving the first and second probes individually along a plane parallel to the substrate to be processed; voltage applying means for applying an electric voltage to between the second probe and the substrate to be processed; stage driving means for moving the first and second stages in a direction along the same plane as the surface of the first and second substrates to be processed, respectively; and control means for controlling the probe fine-motion means, the probe moving means, the voltage applying means, and the stage driving means, wherein a change in the position of the first probe as the first and second probes are relatively moved relative to the surfaces of the first and second substrates, respectively, and along the surfaces of the first and second substrates, respectively, by use of the probe moving means or the stage driving means, is detected by use of the probe position detecting means, and wherein the voltage applied to the second probe by the voltage applying means is changed in accordance with the output of the probe position detecting means, whereby a pattern is formed on the second substrate.

In accordance with this form of the present invention as recited in item (7), the apparatus may comprise a stage on which an original is placed and a stage on which a workpiece substrate to be processed is placed, wherein the original may be scanned by a reading head and the substrate may be scanned by a writing head synchronously. This avoids the necessity of pattern data itself, and removes the necessity of using data converting means for converting data into processing data as well as data storing means for storing the same. The structure of the apparatus can be made vary simple. Furthermore, a workpiece substrate having a pattern already transferred thereto may be used as an original. This effectively decreases the cost of original preparation. Furthermore, the apparatus may comprise a plurality of stages each for carrying a workpiece substrate thereon. This enables transferring a pattern to plural workpiece substrates simultaneously, and thus the throughput can be improved considerably.

(8) A fine pattern forming apparatus, comprising a first cantilever having a first probe mounted thereon; a second cantilever having a second probe mounted thereon; probe position detecting means for detecting the positions of the first and second probes individually on the basis of motions of the first and second cantilevers; a first stage for carrying thereon a first substrate; a second stage for carrying thereon a second substrate; probe fine-motion means for moving the first and second probes individually toward or away from the first and second substrates, respectively; probe moving means for moving the first and second probes individually along a plane parallel to the substrate to be processed; voltage applying means for applying an electric voltage to between the second probe and the substrate to be processed; stage driving means for moving the first and second stages in a direction along the same plane as the surface of the first and second substrates to be processed, respectively; and control means for controlling the probe fine-motion means, the probe moving means, the voltage applying means, and the stage driving means, wherein the apparatus includes a plurality of combinations each comprising a first stage having a first substrate placed thereon and a corresponding first probe, wherein changes in position of the first probes as the first probes are relatively moved relative to and along the surfaces of the first substrates while the second probe is relatively moved relative to and along the surface of the second substrate by use of the probe moving means or the stage driving means, are detected by use of the probe position detecting means, and then a composite output is produced by combining plural outputs of the probe position detecting means, and wherein the voltage applied to the second probe by the voltage applying means is changed in accordance with the composite output, whereby a pattern is formed on the second substrate.

In accordance with the form of the present invention as recited in item (8), the apparatus may comprise a plurality of stages each for carrying an original thereon, and separate pattern information obtainable by scanning the originals by using separate reading heads may be combined and supplied to a writing head as an applied voltage. Thus, even a complicated pattern can be prepared by dividing the same into separate originals, and the original preparation cost can be decreased effectively.

(9) A fine pattern forming apparatus as recited in item (7) or (8), wherein relative movements of the first and second probes relative to the first and second substrates, respectively, are made synchronously.

(10) A fine pattern forming apparatus as recited in item (9), wherein the synchronous motion is carried out while the movement speed of the second probe with respect to the movement speed of the first probe, or the driving speed of the second stage with respect to the driving speed of the first stage has a certain ratio.

In accordance with the form of the present invention as recited in item (10), the scan speeds of the reading head and the writing head may have a certain ratio. This enables reduced scale pattern drawing as well as enlarged scale pattern drawing. Furthermore, it enables correction of various errors such as process distortion, an error peculiar to a stage used, a magnification error and the like. Since the reduced scale pattern drawing can be done, the original pattern can be prepared in a magnified scale. This relieves the need for dimensional precision.

(11) A fine pattern forming apparatus as recited in item (7) or (8), wherein the apparatus comprises a plurality of second stages, so that patterns being the same as the pattern of the first substrate are formed on the second substrates simultaneously.

(12) A fine pattern forming apparatus as recited in item (7) or (8), wherein the first substrate is an original and the second substrate is a workpiece substrate to be processed.

(13) A fine pattern forming apparatus, comprising a plurality of cantilevers each having a probe mounted thereon; probe position detecting means for detecting the positions of the probes individually on the basis of motions of the plurality of cantilevers; a first stage for carrying thereon a first substrate; a second stage for carrying thereon a second substrate; probe fine-motion means for moving the probes individually toward or away from the first or second substrate; first and second probe heads each being adapted to hold a predetermined number of probes, out of the probes described above, along a plane; probe head fine-motion means for moving the first and second probe heads individually toward and away from the first and second substrates, respectively; probe head moving means for moving the first and second probe heads individually along a plane parallel to the substrate or the second substrate; voltage applying means for applying an electric voltage to between the probes of the second probe head and the second substrate; stage driving means for moving the first and second stages in a direction along the same plane as the surface of the first and second substrates, respectively; and control means for controlling the probe fine-motion means, the probe head fine-motion means, the probe head moving means, the voltage applying means, and the stage driving means, wherein changes in position of the probes of the first probe head as the first probe head is relatively moved relative to and along the surface of the first substrate while the second probe head is relatively moved relative to and along the surface of the second substrate by use of the probe head moving means or the stage driving means, are detected by use of the probe position detecting means, and wherein the voltages applied to the probes of the second probe head by the voltage applying means are changed in accordance with the output of the probe position detecting means, whereby a pattern is formed on the second substrate.

(14) A fine pattern forming apparatus, comprising a plurality of cantilevers each having a probe mounted thereon; probe position detecting means for detecting the positions of the probes individually on the basis of motions of the plurality of cantilevers; a first stage for carrying thereon a first substrate; a second stage for carrying thereon a second substrate; probe fine-motion means for moving the probes individually toward or away from the first or second substrate; first and second probe heads each being adapted to hold a predetermined number of probes, out of the probes described above, along a plane; probe head fine-motion means for moving the first and second probe heads individually toward and away from the first and second substrates, respectively; probe head moving means for moving the first and second probe heads individually along a plane parallel to the substrate or the second substrate; voltage applying means for applying an electric voltage to between the probes of the second probe head and the second substrate; stage driving means for moving the first and second stages in a direction along the same plane as the surface of the first and second substrates, respectively; and control means for controlling the probe fine-motion means, the probe head fine-motion means, the probe head moving means, the voltage applying means, and the stage driving means, wherein the apparatus includes a plurality of combinations each comprising a first stage having a first substrate placed thereon and a corresponding first probe head, wherein changes in position of the probes of the first probe heads as the first probe heads are relatively moved relative to and along the surfaces of the corresponding first substrates while the second probe head is relatively moved relative to and along the surface of the second substrate by use of the probe moving means or the stage driving means, are detected by use of the probe position detecting means, and then a composite output is produced by combining plural outputs of the probe position detecting means, and wherein the voltages applied to the corresponding probes of the second probe head by the voltage applying means are changed in accordance with the composite output, whereby a pattern is formed on the second substrate.

(15) A fine pattern forming apparatus as recited in item (13) or (14), wherein relative movements of the first and second probe heads relative to the first and second substrates, respectively, are made synchronously.

(16) A fine pattern forming apparatus as recited in item (15), wherein the synchronous motion is carried out while the movement speed of the second probe head with respect to the movement speed of the first probe head, or the driving speed of the second stage with respect to the driving speed of the first stage has a certain ratio.

(17) A fine pattern forming apparatus as recited in item (13) or (14), wherein the apparatus comprises a plurality of second stages, so that patterns being the same as the pattern of the first substrate are formed on the second substrates simultaneously.

(18) A fine pattern forming apparatus as recited in item (13) or (14), wherein the first substrate is an original and the second substrate is a workpiece substrate to be processed.

(19) A fine pattern forming apparatus as recited in item (9) or (15), wherein the stage driving means includes a pulse controller and drivers for the first and second stages, and wherein a pulse train outputted by the pulse controller in accordance with a drive command supplied from the control means is applied to the drivers for the first and second stages simultaneously.

(20) A fine pattern forming apparatus as recited in item (19), wherein a pulse outputted from the pulse controller and to be applied to the driver for the first stage is divided or multiplied and it is applied to the driver for the second stage simultaneously, whereby a certain ratio is created between the driving speed of the first stage and the speed of the second stage.

(21) A fine pattern forming apparatus as recited in item (20), wherein the apparatus comprises a plurality of combinations each having a second stage and a driver for the second stage, and wherein the combinations have different pulse dividing rations or multiplying ratios.

(22) A fine pattern forming apparatus as recited in item (12) or (18), wherein the original is a workpiece substrate having a pattern formed thereon.

(23) A fine pattern inspecting apparatus, comprising a first cantilever having a first probe mounted thereon; a second cantilever having a second probe mounted thereon; probe position detecting means for detecting the positions of the first and second probes individually on the basis of motions of the first and second cantilevers; probe fine-motion means for moving the first and second probes individually toward or away from a substrate; probe moving means for moving the first and second probes individually along a plane parallel to the substrate; a stage on which the substrate is placed; stage driving means for moving the stage in a direction along the same plane of the surface of the substrate; and control means for controlling the probe fine-motion means, the probe moving means, and the stage driving means, wherein changes in the position of the first and second probes as the first and second probes are relatively moved relative to the substrate and along the surface of the substrate by use of the probe moving means or the stage driving means, are detected by use of the probe position detecting means, so that the changes in the position of the two probes are compared with each other.

In accordance with this form of the present invention as recited in item (23), in a fine pattern inspecting apparatus having a scanning probe microscope for pattern drawing inspection of a circuit pattern of a semiconductor device, different regions on one and the same substrate are scanned by using two reading probes or reading heads and resultant data are compared with each other. Alternatively, substrates on two stages may be scanned by two reading heads and the resultant data may directly be compared with each other. The state or quality of pattern drawing can thus be checked quickly and easily.

(24) A fine pattern inspecting apparatus as recited in item (23), wherein the relative motions of the first and second probes relative to the substrate are carried out synchronously.

(25) A fine pattern inspecting apparatus, comprising a plurality of cantilevers each having a probe mounted thereon; probe position detecting means for detecting the positions of the probes individually on the basis of motions of the plurality of cantilevers; probe fine-motion means for moving the probes individually toward or away from a substrate; first and second probe heads each being arranged to hold a predetermined number of probes, out of the probes described above, along a plane; probe head fine-motion means for moving the first and second probe heads individually toward and away from the substrate; probe head moving means for moving the first and second probe heads individually along a plane parallel to the substrate; a stage on which the substrate is placed; stage driving means for moving the stage in a direction along the same plane of the surface of the substrate; and control means for controlling the probe fine-motion means, the probe head fine-motion means, the probe head moving means, and the stage driving means, wherein changes in the position of the probes of the first probe head and of the probes of the second probe head as the first and second probe heads are relatively moved relative to and along the surface of the substrate by use of the probe head moving means or the stage driving means, are detected by use of the probe position detecting means, so that the changes in the position of corresponding probes of the two probe heads are compared with each other.

(26) A fine pattern inspecting apparatus as recited in item (25), wherein the relative motions of the first and second probe heads relative to the substrate are carried out synchronously.

(27) A fine pattern inspecting apparatus, comprising a plurality of cantilevers each having a probe mounted thereon; probe position detecting means for detecting the positions of the probes individually on the basis of motions of the plurality of cantilevers; a first stage on which a first substrate is mounted; a second stage on which a second substrate is mounted; probe fine-motion means for moving the probes individually toward or away from the first substrate or the second substrate; first and second probe heads each being arranged to hold a predetermined number of probes, out of the probes described above, along a plane; probe head fine-motion means for moving the first and second probe heads individually toward and away from the first and second substrates, respectively; probe head moving means for moving the first and second probe heads individually along a plane parallel to the first and second substrates, respectively; stage driving means for moving the first and second stages in a direction along the same plane of the surface of the first or second substrate; and control means for controlling the probe fine-motion means, the probe head fine-motion means, the probe head moving means, and the stage driving means, wherein changes in the position of the probes of the first probe head and of the probes of the second probe head as the first probe head is relatively moved relative to and along the surface of the first substrate while the second probe head is relatively moved relative to and along the surface of the second substrate, by use of the probe head moving means or the stage driving means, are detected by use of the probe position detecting means, so that the changes in the position of corresponding probes of the two probe heads are compared with each other.

(28) A fine pattern inspecting apparatus as recited in item (27), wherein the relative motions of the first and second probes relative to the first and second substrates, respectively, are carried out synchronously.

(29) A fine pattern inspecting apparatus as recited in item (27), wherein the first substrate is an original and the second substrate is a workpiece substrate to be processed.

(30) A fine pattern inspecting apparatus as recited in item (29), wherein the original is a workpiece substrate having a pattern formed thereon.

(31) A fine pattern forming apparatus as recited in any one of items (1), (4), (7), (8), (13) and (14) and a fine pattern inspecting apparatus as recited in any one of items (23), (25) and (27), wherein the stage is provided with a reference mark, and wherein reference mark measuring means for measuring the reference mark is provided in association with the stage.

(32) A fine pattern forming apparatus and a fine pattern inspecting apparatus as recited in item (31), wherein the measurement of the reference mark is carried out by moving the first probe or the first probe head relatively to the reference mark and by detecting a change in position of the first probe or changes in position of the probes of the first probe head.

(33) A fine pattern forming apparatus, comprising: surface irregularity information reading means for detecting a shape signal corresponding to a surface irregularity of a surface of an original, while scanning the surface by use of a first probe; and surface irregularity information writing means for processing a substrate to be processed, while scanning a surface of the substrate by use of a second probe; wherein an applied electric voltage to the second probe is changed in accordance with the shape signal while a distance between the second probe and the substrate is kept substantially constant, or the distance between the second probe and the substrate is changed in accordance with the shape signal while the applied electric voltage to the second probe is kept substantially constant, such that the substrate is processed in accordance with the surface irregularity of the original.

(34) A fine pattern forming apparatus as recited in item (33), wherein detection of the shape signal by said surface irregularity information reading means and processing of the substrate by said surface irregularity information writing means are carried out simultaneously.

(35) A fine pattern forming apparatus as recited in item (34), wherein, when a position on the substrate that corresponds to a detection position where the shape signal detection by said surface irregularity information reading means is carried out is taken as a processing position, said surface irregularity information writing means performs the processing with respect to the processing position substantially simultaneously as the shape signal detection is carried out by said surface irregularity information reading means with respect to the detection position.

(36) A fine pattern forming apparatus as recited in item (33), wherein the substrate is processed so that a shape the same as or analogous to the surface irregularity of the original is formed thereon.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2004-167920 filed Jun. 7, 2004, for which is hereby incorporated by reference.

What is claimed is:

1. A fine pattern forming apparatus, comprising:
surface irregularity information reading means having a first probe being relatively movable along a surface of a planar plate having a pattern defined by a surface irregularity, said surface irregularity information reading means being adapted to detect surface irregularity information of the surface of the planar plate on the basis of displacement of the first probe as the same is relatively moved relative to the planar plate; and
surface irregularity information writing means having a second probe being relatively movable along a surface of a substrate to be processed, said surface irregularity information writing means is adapted to relatively move the second probe along the surface of the substrate to be processed and to apply an electric voltage, in accordance with the surface irregularity information of the planar plate, to between the second probe and the surface of the substrate, so that a pattern corresponding to the surface irregularity pattern of the planar plate can be formed on the surface of the substrate.

2. An apparatus according to claim 1, wherein the planar plate is one region of the substrate to be processed, where a pattern based on surface irregularity is already formed on.

3. An apparatus according to claim 1, wherein a plurality of originals are prepared each being as the planar plate as aforesaid, wherein said surface irregularity information reading means includes a plurality of probes each being the first probe as aforesaid, in association with the plurality of originals, respectively, wherein said surface irregularity information reading means is arranged to cause synchronous relative movements of the plurality of first probes relative to the surfaces of the originals, respectively, and wherein said surface irregularity information writing means is arranged to apply, to between the second probe and the substrate to be processed, an electric voltage corresponding to a combined output of plural surface irregularity information detected on the basis of displacements of the plurality of first probes, respectively.

4. An apparatus according to claim 1, wherein the relative movements of the first and second probes are carried out synchronously.

5. An apparatus according to claim 1, wherein said apparatus includes a plurality of probes each being the second probe as aforesaid, and wherein said surface irregularity information writing means is arranged to apply electric voltages to the plurality of second probes individually so that plural same patterns can be formed on the substrate.

6. An apparatus according to claim 5, wherein said surface irregularity information writing means is arranged to apply electric voltages to the plurality of second probes individually so that plural same patterns can be formed on different substrates to be processed.

7. An apparatus according to claim 1, wherein said apparatus includes a plurality of probes each being the first probe as aforesaid and a plurality of probes each being the second probe as aforesaid, wherein the plurality of first probes are held by a first probe head through first probe moving means for individually moving the plurality of first probes toward and away from the planar plate, wherein the plurality of second probes are held by a second probe head through second probe moving means for individually moving the plurality of second probes toward and away from the substrate to be processed, wherein said surface irregularity information reading means is arranged to detect changes in the position of the plurality of first probes as said first probe head is relatively moved along the surface of the planar plate, and wherein said surface irregularity information writing means is arranged to apply electric voltages to the plurality of second probes, respectively, in accordance with positional information read by said surface irregularity information reading means in relation to the corresponding first probes.

8. An apparatus according to claim 1, further comprising a movable stage with a reference mark, for carrying thereon the planar plate and the substrate to be processed, and reference mark measuring means associated with said movable stage for measuring the reference mark provided thereon.

9. An apparatus according to claim 8, wherein said reference mark measuring means measures the reference mark by moving one of the first probe and a first probe head having plural probes to the reference mark and by detecting a change in the position of the first probe or a change in the position of the plural probes of the first probe head.

10. A fine pattern forming apparatus, comprising:
surface irregularity information reading means for detecting a shape signal corresponding to a surface irregularity of a surface of an original, while scanning the surface by use of a first probe; and
surface irregularity information writing means for processing a substrate to be processed, while scanning a surface of the substrate by use of a second probe;
wherein an applied electric voltage to the second probe is changed in accordance with the shape signal while a distance between the second probe and the substrate is kept substantially constant, or the distance between the second probe and the substrate is changed in accordance with the shape signal while the applied electric voltage to the second probe is kept substantially constant, such that the substrate is processed in accordance with the surface irregularity of the original.

11. An apparatus according to claim 10, wherein detection of the shape signal by said surface irregularity information reading means and processing of the substrate by said surface irregularity information writing means are carried out simultaneously.

12. An apparatus according to claim 11, wherein, when a position on the substrate that corresponds to a detection position where the shape signal detection by said surface irregularity information reading means is carried out is taken as a processing position, said surface irregularity information writing means performs the processing with respect to the processing position substantially simultaneously as the shape signal detection is carried out by said surface irregularity information reading means with respect to the detection position.

13. An apparatus according to claim 10, wherein the substrate is processed so that a shape the same as or analogous to the surface irregularity of the original is formed thereon.

14. A fine pattern inspecting apparatus, comprising:
first surface irregularity information reading means having a first probe being relatively movable along a surface of a first substrate having a pattern defined by a surface irregularity, said first surface irregularity information reading means being adapted to detect surface irregularity information of the surface of the first substrate on the basis of displacement of the first probe as the same is relatively moved relative to the first substrate; and
second surface irregularity information reading means having a second probe being relatively movable along a surface of a second substrate having a pattern defined by a surface irregularity, said second surface irregularity information reading means being adapted to detect surface irregularity information of the surface of the second substrate on the basis of displacement of the second probe as the same is relatively moved relative to the second substrate; and
comparing means for comparing the surface irregularity information read by said first surface irregularity information reading means and the surface irregularity information read by said second surface irregularity information reading means, with each other.

15. An apparatus according to claim 14, wherein the first substrate and the second substrate are separate regions of one and the same substrate to be processed.

16. An apparatus according to claim 14, wherein the first substrate and the second substrate are separate substrates to be processed, respectively.

17. An apparatus according to claim 14, wherein said second surface irregularity information reading means includes a plurality of probes each being the second probe as aforesaid, the plurality of second probes corresponding to a plurality of patterns defined by surface irregularities and formed on the substrate to be processed, respectively, wherein said second surface irregularity information reading means reads a plurality of surface irregularity information on the basis of displacements of the plurality of second probes, respectively, and wherein said comparing means compares the plurality of surface irregularity information read by said second surface irregularity information reading means with the surface irregularity information read by said first surface irregularity information reading means.

* * * * *